United States Patent
Lee

(10) Patent No.: US 9,461,266 B2
(45) Date of Patent: Oct. 4, 2016

(54) ORGANIC LIGHT EMITTING DISPLAY APPARATUS HAVING THIN-FILM ENCAPSULATION LAYER WITH INTERLAYER AND THE MANUFACTURING METHOD THEREOF

(71) Applicant: SAMSUNG DISPLAY CO., LTD., Yongin, Gyeonggi-Do (KR)

(72) Inventor: Jae-Ho Lee, Yongin (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/016,050

(22) Filed: Aug. 31, 2013

(65) Prior Publication Data

US 2014/0175397 A1     Jun. 26, 2014

(30) Foreign Application Priority Data

Dec. 20, 2012  (KR) .................. 10-2012-0149836

(51) Int. Cl.
  *H01L 51/00*  (2006.01)
  *H01L 51/52*  (2006.01)
  *H01L 27/28*  (2006.01)

(52) U.S. Cl.
  CPC ....... *H01L 51/5253* (2013.01); *H01L 51/5256* (2013.01); *H01L 27/28* (2013.01); *H01L 51/00* (2013.01)

(58) Field of Classification Search
  USPC ........................................ 257/40, 76–77, 98
  See application file for complete search history.

(56) References Cited

U.S. PATENT DOCUMENTS

| | | | |
|---|---|---|---|
| 8,306,277 B2 | 11/2012 | Ichimasa et al. | |
| 2001/0044035 A1 | 11/2001 | Morii | |
| 2006/0216951 A1 | 9/2006 | Moro et al. | |
| 2008/0157656 A1 | 7/2008 | Liao et al. | |
| 2008/0309226 A1* | 12/2008 | Kim et al. | 313/504 |
| 2009/0110917 A1* | 4/2009 | Albaugh et al. | 428/336 |
| 2009/0289549 A1 | 11/2009 | Lee et al. | |
| 2010/0159792 A1 | 6/2010 | Visser et al. | |
| 2011/0121355 A1 | 5/2011 | Bae et al. | |
| 2012/0133275 A1 | 5/2012 | Lee et al. | |
| 2012/0241811 A1* | 9/2012 | Kim et al. | 257/100 |

FOREIGN PATENT DOCUMENTS

| | | |
|---|---|---|
| JP | 2007-36700 A | 2/2007 |
| JP | 2008-311205 A | 12/2008 |
| KR | 10-2009-0122870 A | 12/2009 |

(Continued)

OTHER PUBLICATIONS

Extended European Search Report mailed Mar. 18, 2014 in corresponding European Patent Application No. 13191014.3.
Korean Office Action in KR 10-2012-0149836, dated Jan. 10, 2014 (LEE).

(Continued)

*Primary Examiner* — Thanh T Nguyen
(74) *Attorney, Agent, or Firm* — Lee & Morse, P.C.

(57) ABSTRACT

An organic light emitting display apparatus includes a substrate, a display unit on the substrate, and a thin-film encapsulation layer for sealing the display unit, the thin-film encapsulation layer including a first organic film, a first inorganic film covering the first organic film, and an interlayer disposed at a lower surface of the first organic film, the interlayer defining an area where the first organic film is formed, an area of the interlayer being the same as the area of the first organic film.

12 Claims, 3 Drawing Sheets

(56) References Cited

FOREIGN PATENT DOCUMENTS

| KR | 10-2011-0058123 A | 6/2011 |
|----|-------------------|--------|
| KR | 10-2012-0057286 A | 6/2012 |
| KR | 10-2012-0109083 A | 10/2012 |

OTHER PUBLICATIONS

Registration Determination Certificate mailed Nov. 15, 2014 in corresponding Korean Patent Application No. 10-2012-0149836.

* cited by examiner

ORGANIC LIGHT EMITTING DISPLAY APPARATUS HAVING THIN-FILM ENCAPSULATION LAYER WITH INTERLAYER AND THE MANUFACTURING METHOD THEREOF

CROSS-REFERENCE TO RELATED APPLICATION

This application claims priority to and the benefit of Korean Patent Application No. 10-2012-0149836, filed on Dec. 20, 2012, in the Korean Intellectual Property Office, and entitled, "ORGANIC LIGHT EMITTING DISPLAY APPARATUS AND THE MANUFACTURING METHOD THEREOF," which is incorporated by reference herein in its entirety.

BACKGROUND

1. Field

Embodiments relate to an organic light emitting display apparatus and a manufacturing method thereof.

2. Description of the Related Art

An organic light emitting display apparatus may include an organic light emitting device including a hole injection electrode, an electron injection electrode, and an organic light emitting layer between the electrodes. The organic light emitting display apparatus is a self-emitting type display device that generates light as excitons, which are generated by combination of holes (injected in the hole injection electrode) and electrons (injected in the electron injection electrode) in the organic light emitting layer, fall from an exited state to a ground state.

The organic light emitting display apparatus, which is a self-emitting type display apparatus, does not need a separate light source. As such, the organic light emitting display apparatus may be operated in a low voltage and formed in a light, thin form, and is becoming the center of public attention as a next-generation display apparatus due to high quality properties such as a wide vision angle, a high contrast, a high response speed, etc.

SUMMARY

Embodiments are directed to an organic light emitting display apparatus, including a substrate, a display unit on the substrate, and a thin-film encapsulation layer for sealing the display unit, the thin-film encapsulation layer including a first organic film, a first inorganic film covering the first organic film, and an interlayer disposed at a lower surface of the first organic film, the interlayer defining an area where the first organic film is formed, an area of the interlayer being the same as the area of the first organic film.

The interlayer may include one or more of an alkali metal salt or an alkali earth metal salt.

The interlayer may include one or more of lithium fluoride, calcium fluoride, magnesium chloride, or sodium chloride.

The interlayer may have a thickness of about 50 Å to about 600 Å.

The organic light emitting display apparatus may further include a second organic film on the first inorganic film, and a second inorganic film covering the second organic film.

The organic light emitting display apparatus may further include a second interlayer for defining an area where the second organic film is formed, the second interlayer being between the first inorganic film and the second organic film.

The organic light emitting display apparatus may further include a third inorganic film on the display unit, the interlayer being between the third inorganic film and the first organic film.

The interlayer may be hydrophilic.

Embodiments are also directed to an organic light emitting display apparatus, including a substrate, a display unit formed on the substrate, and a thin-film encapsulation layer for sealing the display unit, the thin-film encapsulation layer including a plurality of organic films, a plurality of inorganic films alternately laminated with the plurality of organic films, and an interlayer formed on a lower surface of an organic film on at least a lowest layer among the organic films, the interlayer including one or more of an alkali metal salt or an alkali earth metal salt.

The interlayer may include one or more of lithium fluoride, calcium fluoride, magnesium chloride, or sodium chloride.

The interlayer may define an area where the organic film on the lowest layer is formed, and an area of the interlayer may be the same as the area of the organic film on the lowest layer.

The interlayer may be formed on the lower surface of each of the plurality of organic films.

The interlayer may be hydrophilic.

The interlayer may contact the display unit.

Embodiments are also directed to a method of manufacturing an organic light emitting display apparatus, the method including forming a display unit on a substrate, and forming a thin-film encapsulation layer for sealing the display unit, the forming of the thin-film encapsulation layer including forming an interlayer on the display unit, the interlayer including at least one of an alkali metal salt and an alkali earth metal salt, forming a first organic film corresponding to the interlayer, and forming a first inorganic film to cover the first organic film, the first organic film being formed on only an area where the interlayer is formed.

The interlayer may have a thickness of about 50 Å to about 600 Å.

The interlayer may include one or more of lithium fluoride, calcium fluoride, magnesium chloride, or sodium chloride.

The method may further include forming a second organic film on the first inorganic film, and forming a second inorganic film to cover the second organic film.

The method may further include forming a second interlayer on the first inorganic film before forming the second organic film. The second organic film may be formed on only an area where the second interlayer is formed.

The method may further include forming a third inorganic film to cover the display unit before forming the interlayer.

The method may further include plasma-processing the third inorganic film before forming the interlayer.

BRIEF DESCRIPTION OF THE DRAWINGS

Features will become apparent to those of skill in the art by describing in detail example embodiments with reference to the attached drawings in which.

DETAILED DESCRIPTION

Figure 1:
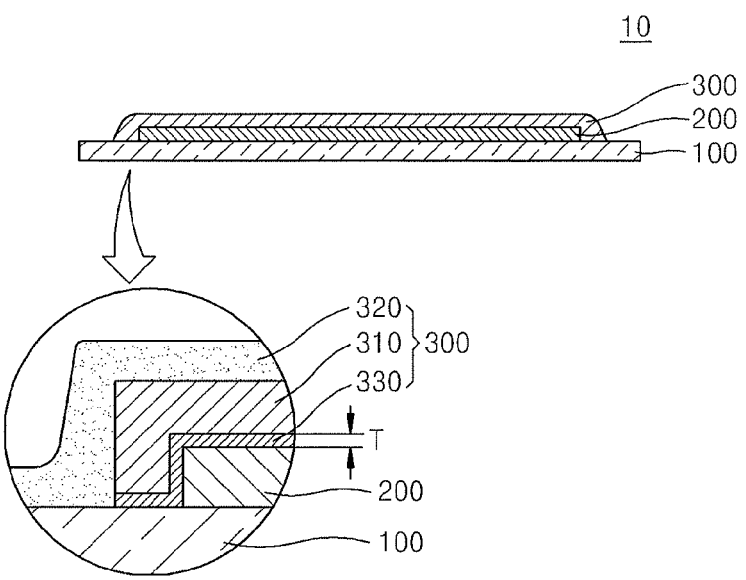
FIG. 1 is a cross-sectional diagram schematically illustrating an organic light emitting display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. In the case where a position relationship between two items are described with the terms "on ~," "on the top of ~," or the like, one or more items may be interposed therebetween unless a description is given without the term "directly." Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

The terms such as "first" and "second" may be used to describe various components, but the components should not be limited by such terms. The terms are used only to distinguish one component from another component.

Figure 2:
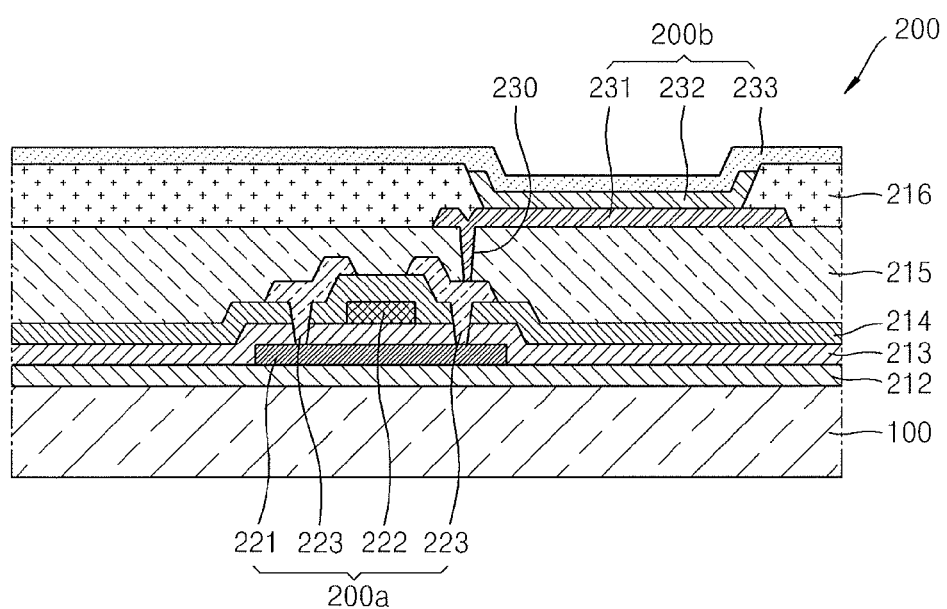
FIG. 2 is an enlarged cross-sectional diagram illustrating a display unit of the organic light emitting display apparatus of FIG. 1.

FIG. 1 is a cross-sectional diagram schematically illustrating an organic light emitting display apparatus according to an example embodiment, and FIG. 2 is an enlarged cross-sectional diagram illustrating a display unit of the organic light emitting display apparatus of FIG. 1.

Referring to FIGS. 1 and 2, an organic light emitting display apparatus 10 may include a substrate 100, a display unit 200 on the substrate 100, and an encapsulation layer 300 for sealing the display unit 200.

The substrate 100 may be a flexible substrate, and may be formed of, e.g., a plastic having superior heat-resistance and durability, such as polyimide, polyethylene terephthalate (PET), polycarbonate, polyethylene naphthalate, polyarylate (PAR), polyetherimide, etc. However, embodiments are not limited to these examples, and the substrate 120 may be formed of a material such as metal, glass, etc.

The display unit 200 may include an organic thin-film transistor layer 200a and a pixel unit 200b. The pixel unit 200b may be an organic light emitting device. Hereinafter, the display unit 200 will be described in detail with reference to FIG. 2.

A buffer layer 212 may be formed on the substrate 100. The buffer layer 212 may help prevent infiltration of impurities and other elements through the substrate 100 and may help provide a flat plane on the upper side of the substrate, and may be formed of various materials for performing such roles. For example, the buffer layer 212 may contain an inorganic material such as silicon oxide, silicon nitride, silicon oxynitride, aluminum oxide, aluminum nitride, titanium oxide, titanium nitride, etc., or an organic material such as polyimide, polyester, acryl, etc., and/or may be formed of a laminate of such materials.

The thin-film transistor (TFT) layer 200a may be formed on the buffer layer 212. The present embodiment illustrates a top-gate type thin-film transistor as an example of the thin-film transistor layer 200a, but a thin-film transistor having a different structure may also be used.

The thin-film transistor layer 200a may include an active layer 221, a gate electrode 222, and source and drain electrodes 223.

In an implementation, the active layer 221 may be formed by a semiconductor material on the buffer layer 212, and a gate insulating film 213 may be formed to cover the active layer 221. An inorganic semiconductor, such as amorphous silicon or polysilicon, or an organic semiconductor may be used as the active layer 221. The active layer 221 may include a source region, a drain region, and a channel region between the source region and the drain region. The gate insulating film 213 may be used to insulate the active layer 221 from the gate electrode 222, and may be formed of an organic material or an inorganic material such as $SiN_x$, $SiO_2$, etc.

The gate electrode 222 may be provided on the gate insulating film 213, and an interlayer insulating film 214 may be formed to cover the gate insulating film 213.

The gate electrode 222 may contain, e.g., Au, Ag, Cu, Ni, Pt, Pd, Al, Mo, etc., and/or alloys such as Al:Nd and Mo: W, but the gate electrode 222 is not limited to these examples.

The interlayer insulating film 214 may be disposed between the gate electrode 222 and the source and drain electrodes 223 for insulation between the electrodes, and may be formed of an inorganic material such as $SiN_x$, $SiO_2$, etc.

The source and drain electrodes 223 may be formed on the interlayer insulating film 214. The interlayer insulating film 214 and the gate insulating film 213 may be formed to expose the source area and drain area of the active layer 221, and the source and drain electrodes 223 may be formed to contact the exposed source area and drain areas of the active layer 221.

FIG. 2 illustrates a top-gate type thin-film transistor (TFT)) sequentially including the active layer 221, the gate electrode 222, and the source and drain electrode 223, but embodiments are not limited to this example, and the gate electrode 222 may be disposed on the lower part of the active layer 221.

The thin-film transistor (TFT) layer 200a may be electrically connected to the pixel unit 200b to operate the pixel unit 200b, and may be covered by an overcoat film 215.

An inorganic insulating film and/or an organic insulating film may be used as the overcoat film 215. The inorganic insulating film may include, e.g., $SiO_2$, $SiN_x$, SiON, $Al_2O_3$, $TiO_2$, $Ta_2O_5$, $HfO_2$, $ZrO_2$, BST, PZT, etc., and the organic insulating film may include, e.g., a general polymer (PMMA, PS), a polymer derivative having a phenolic group, an acrylate polymer, an amide polymer, an aryl ether polymer, an amaid polymer, a fluorinated polymer, a p-xylene polymer, a vinyl alcohol polymer, a blend thereof, etc. The overcoat film 215 may also be formed of a composite laminate of an inorganic insulating film and an organic insulating film.

The pixel unit 200b may be formed on the overcoat film 215. The pixel unit 200b may include a pixel electrode, an intermediate layer 232, and a counter electrode 233.

The pixel electrode 231 may be formed on the overcoat film 215 and may be electrically connected to the source or drain electrode 223 through a contact hole 230 formed on the overcoat film 215.

The pixel electrode 231 may be a reflective electrode. The pixel electrode 231 may include, e.g., Ag, Mg, Al, Pt, Pd, Au, Ni, Nd, Ir, Cr, an alloy thereof, etc. The pixel electrode 231 may be a reflective film. The pixel electrode 231 may be a transparent or semitransparent electrode layer. The transparent or semitransparent electrode layer may include one or more of indium tin oxide (ITO), indium zinc oxide (IZO), zinc oxide (ZnO), indium oxide ($In_2O_3$), indium gallium oxide (IGO), or aluminum zinc oxide (AZO).

The counter electrode 233 may be disposed to face the pixel electrode 231 and may be a transparent or semitransparent electrode. The counter electrode 233 may be formed of a metal thin film with small work function such as, e.g., Li, Ca, LiF/Ca, LiF/Al, Al, Ag, Mg, an alloy thereof, etc. An auxiliary electrode layer or bus electrode may be further formed of materials for a transparent electrode such as ITO, IZO, ZnO, or $In_2O_3$ on a metal thin film.

The counter electrode 233 may transmit light emitted from an organic light emitting layer that is included in the intermediate layer 232. Light emitted from the organic light emitting layer may be reflected directly or by the pixel electrode 231 formed of a reflective electrode so as to be emitted to the counter electrode 233.

The organic light emitting display apparatus 10 of the present embodiment is not limited to a front emitting type, and the organic light emitting display apparatus 10 may also be a back emitting type, in which light emitted from the organic light emitting layer is emitted to the substrate 100. In this case, the pixel electrode 231 may be formed of a transparent or semitransparent electrode, and the counter electrode 233 may be formed of a reflective electrode. Further, the organic light emitting display apparatus 10 of the present embodiment may be a both-side emitting type that emits light in both front and back directions.

A pixel definition layer 216 may be formed on the pixel electrode 231. The pixel definition layer 216 may expose a predetermined area of the pixel electrode 231, and the intermediate layer 232 including the organic light emitting layer may be positioned in the exposed area.

The organic light emitting layer may be formed of, e.g., a low molecular weight organic material or a polymeric organic material. The intermediate layer 232 may include a functional layer such as a hole transport layer (HTL), a hole injection layer (HIL), an electron transport layer (ETL), and/or an electron injection layer (EIL) in addition to the organic light emitting layer.

Referring to FIG. 1 again, the encapsulation layer 300 seals the display unit 200 and may help prevent deterioration of the display unit 200. The encapsulation layer 300 may include a first organic film 310, a first inorganic film 320 covering the first organic film 310, and an interlayer 330 formed on the lower surface of the first organic film 310.

The first organic layer 310, for example, may be formed to cover the display unit 200. The first organic layer 310 may be formed of an organic material having flexibility such as polyurea or polyacrylate, and thus the first organic layer 310 may relax internal stress of the inorganic film 320 or enhance the effect of preventing permeation of external moisture or oxygen by filling a fine crack and pin hole of the inorganic film 320.

The first inorganic film 320 may be formed of a moisture-resistant inorganic material such as $SiN_x$, $Al_2O_3$, $SiO_2$, $TiO_2$, etc. The first inorganic film 320 may be formed to cover the first organic film 310.

FIG. 1 illustrates that the encapsulation layer 300 includes the first organic film 310 and the first inorganic film 320, but embodiments are not limited to this example, and the encapsulation layer 300 may be formed by alternate lamination of a plurality of organic films and inorganic films, and the inorganic film may be first formed to contact the display unit 200, which will be described below with reference to FIGS. 3 and 4.

The interlayer 330 may include one or more of an alkali metal salt or an alkali earth metal salt, which may be strongly bonded with a liquid type monomer that may be used to form the first organic film 310. In an implementation, the interlayer 330 may include one or more of LiF, $CaF_2$, $MgCl_2$, or NaCl.

The interlayer 330 may be hydrophilic and define an area where the first organic film 310 is formed. For example, after the interlayer 330 is formed on the display unit 200, there may be an energy difference between an area where the interlayer 330 is formed and an area where the interlayer is not formed. Thus, a liquid type monomer, which may be used to form the first organic film 310, may be deposited only in the area where the interlayer 330 is formed.

The area of the first organic film 310 may be the same as the area of the interlayer 330. The first organic film 310 and the interlayer 330 may be laterally coextensive. The interlayer 330 may clearly set a boundary where the first organic film 310 is formed. Thus, the first organic film 310 may be prevented from being exposed to the outside (e.g., as an edge tail), and thereby the side or lateral moisture resistance of the organic light emitting display apparatus 10 may be improved, and a dead area of the organic light emitting display apparatus 10 may be decreased.

The interlayer 330 may be formed with a thickness T of, e.g., about 50 Å to about 600 Å. If the thickness T of the interlayer 330 is smaller than 50 Å, the interlayer 330 may not be uniformly formed, but may be formed discontinuously. For example, the interlayer 330 may be formed in an island type, and thus there may be a defect in the first organic film 310 formed on the interlayer 330. In contrast, if the thickness T of the interlayer 330 is greater than 600 Å, the optical vision angle of the organic light emitting display apparatus 10 may be changed, and the luminance of the organic light emitting display apparatus 10 may be deteriorated as the unique color of the material contained in the interlayer 330 is revealed. Hence, the interlayer 330 may be formed with a thickness of about 50 Å to about 600 Å.

Figure 3:
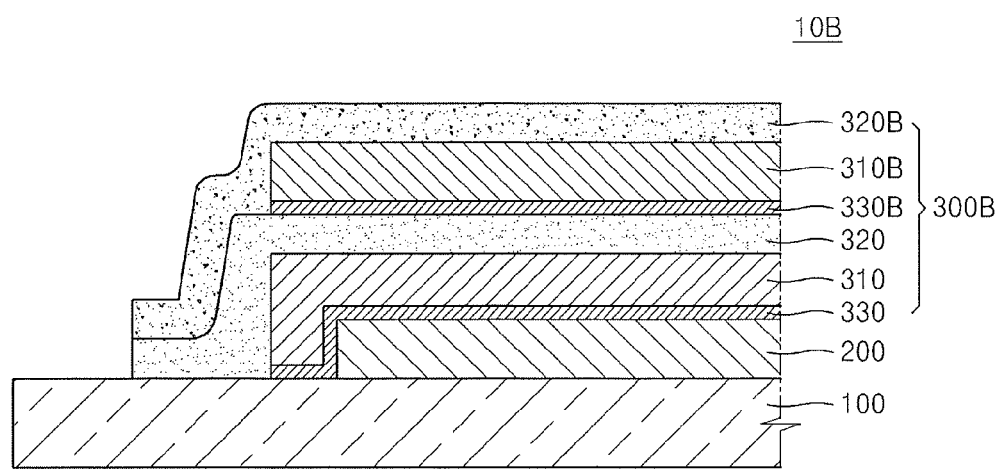
FIGS. 3 and 4 are cross-sectional diagrams illustrating modified examples of the organic light emitting display apparatus of FIG. 1.
Figure 4:
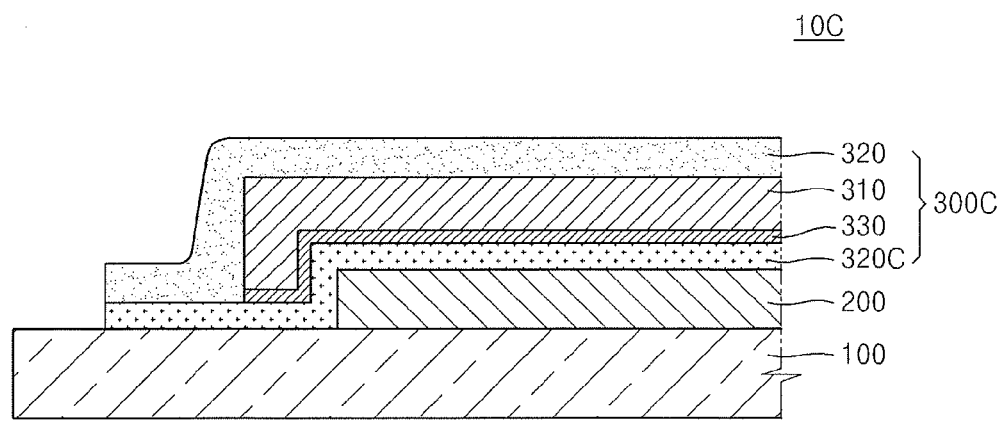

FIGS. 3 and 4 are cross-sectional diagrams illustrating modified examples of the organic light emitting display apparatus of FIG. 1.

Referring to FIG. 3, the organic light emitting display apparatus 10B may include the substrate 100, the display unit 200 formed on the substrate 100, and an encapsulation layer 300B that seals the display unit 200. The substrate 100 and the display unit 200 have already been described with reference to FIGS. 1 and 2, and thus details thereof will not be repeated here.

The encapsulation layer 300B may include the first organic film 310, the first inorganic film 320 for covering the first organic film 310, a second organic film 310B formed on the first inorganic film 320, and a second inorganic film 320B for covering the second organic film 310B.

The encapsulation layer 300B may be formed by alternate lamination of a plurality of organic films 310 and 310B and inorganic films 320 and 320B. Further, though not illustrated in the drawings, an organic layer (not shown) and an inorganic layer (not shown) may be further formed. Further, the interlayer 330 may be formed on the lower surface of the first organic film 310 of at least the lowest layer among a plurality of organic films 310 and 310B. Penetration of external moisture or oxygen into the display unit 200 may be more effectively prevented by limiting an area where the first organic film 310 closest to the display unit 200 is formed.

A second interlayer 330B, for defining an area where the second organic film 310B is formed, may be further formed between the first inorganic film 320 and the second organic film 310B. The second interlayer 330B may be formed of the same material as that of the interlayer 330, and may perform the same function as that of the interlayer 330. Thus, the second organic film 310B may be prevented from being extended to the outer block by clearly setting the boundary where the second organic film 310B is formed.

The organic light emitting display apparatus 10C of FIG. 4 may include the substrate 100, the display unit 200 formed on the substrate 100, and an encapsulation layer 300C that seals the display unit 200. The substrate 100 and the display unit 200 have already been described with reference to FIGS. 1 and 2, and thus details thereof will not be repeated here.

The encapsulation layer 300C of FIG. 4 may include the first organic film 310, the first inorganic film 320 for covering the first organic film 310, the interlayer 330 formed on the lower surface of the first organic film 310, and a third inorganic film 320C formed on the display unit 200. The third inorganic film 320C may first be laminated, and then the first organic film 310 and the first inorganic film 320 may be laminated. The interlayer 330 may define the area where the first organic film 310 is formed and may be formed between the third inorganic film 320C and the first organic film 310.

In an implementation, the third inorganic film 320C may be plasma-processed so as to have a hydrophilic surface. A hydrophilic surface for the third inorganic film 320C may improve bonding strength with the interlayer 330 formed on the third inorganic film 320C. The third inorganic film 320C may block plasma, and thus the pixel unit 200b of the display unit 200, etc. may be prevented from being damaged by the plasma when plasma-processing.

The organic light emitting display apparatus 10C may further include the thin-film encapsulation layer (300B of FIG. 3) illustrated in FIG. 3.

Figure 5:
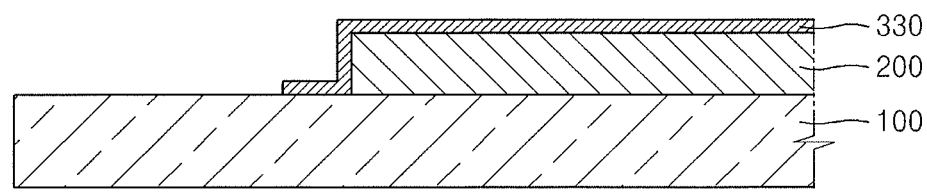
FIGS. 5 to 7 are cross-sectional diagrams schematically illustrating a method of manufacturing the organic light emitting display apparatus of FIG. 1.
Figure 6:
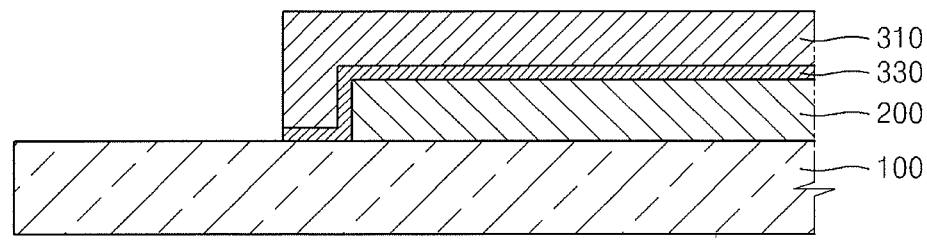
Figure 7:
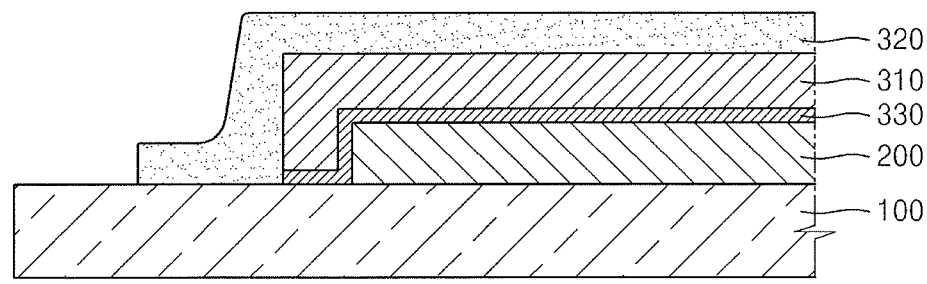

FIGS. 5 to 7 are cross-sectional diagrams schematically illustrating a method of manufacturing the organic light emitting display apparatus of FIG. 1.

Referring to FIG. 5, the display unit 200 and the interlayer 330 may be formed on the substrate 100. The display unit 200 may have a configuration illustrated in FIG. 2 and various organic light emitting displays may be applied.

The interlayer 330 may be formed with a thickness of about 50 Å to about 600 Å, and may include one or more of alkali metal salt or alkali earth metal salt. For example, the interlayer 330 may include one or more of LiF, $CaF_2$, $MgCl_2$, or NaCl. The interlayer 330 may be formed using various deposition methods. To prevent damage to the display unit 200 when the interlayer 330 is formed directly on the display unit 200, a deposition method that does not use plasma may be used.

Further, though not illustrated in the drawings, the third inorganic film (320C of FIG. 4) may be first formed to cover the display unit 200 before forming the interlayer 330. If the third inorganic film (320C of FIG. 4) is formed first, the third inorganic film (320C of FIG. 4) may block plasma, and thus methods of forming the interlayer 330 may be diversified. Further, after forming the third inorganic film (320C of FIG. 4), a plasma processing for adding hydrophilic property to the third inorganic film (320C of FIG. 4) may be performed to enhance the bonding strength with the interlayer 330.

After forming the interlayer 330, the first organic film 310 may be formed as in FIG. 6.

The first organic film 310 may be formed of, e.g., polyurea or polyacrylate. It may be difficult for such materials to be promptly deposited. Thus, method for the first organic film 310 may evaporate liquid type monomer so as to be deposited on the substrate 100, and then may irradiate ultraviolet rays so as to be polymerized.

The interlayer 330 may be formed of a material which may be easily bonded with a liquid type monomer, and the evaporated liquid type monomer may be deposited only in the area where the interlayer 330 is formed. Hence, the boundary where the first organic film 310 is formed may be clearly set, and thus the dead area of the organic light emitting display apparatus (10 of FIG. 1) may be decreased. Further, the evaporated liquid type monomer may be prevented from being extended to the side, and thus the lateral moisture resistant property of the organic light emitting display apparatus (10 of FIG. 1) may be improved.

Next, as illustrated in FIG. 7, the first inorganic film 320 may be formed to cover the first organic film 310. The first inorganic film 320 may be formed by, e.g., sputtering, atomic layer deposition, chemical vapor deposition, etc. The first inorganic film 320 may include, e.g., $SiN_x$, $SiO_x$, $AlO_x$, $SiC_xN_y$, $SiO_xN_y$, amorphous carbon, $InO_x$, $YbO_x$, etc., but embodiments are not limited to these examples.

Further, though not illustrated in the drawings, after forming the first inorganic film 320, the second organic film (310B of FIG. 3) and the second inorganic film (320B of FIG. 3) may be formed as illustrated in FIG. 3, and an organic layer (not shown) and an inorganic layer (not shown) may be further formed. Further, before the second organic film 310B is formed, the second interlayer 330B for defining the area where the second organic film (310B of FIG. 3) is formed may be further formed.

By way of summation and review, an organic light emitting display apparatus may be deteriorated by external moisture or oxygen. Thus, it may be desirable to seal the organic light emitting device so as to help protect it from external moisture, oxygen, etc. A thin film encapsulation (TFE) layer may be considered for sealing the organic light emitting device. When forming an organic film and an inorganic film, a mask corresponding to the film is placed on a substrate and a pattern may be formed. At this time, an organic material may seep into a gap between the mask and the substrate. The encapsulation feature of the organic film may significantly deteriorated compared to the encapsulation feature of the inorganic film, and thus if the organic material were to seep into a gap between the substrate and the mask, an organic film may be formed between an inorganic film and the substrate or between an inorganic film and an inorganic film, through which oxygen or moisture may infiltrate into a display unit.

As described above, embodiments relate to an organic light emitting display apparatus, of which the side moistureproof property may be improved, and a manufacturing method thereof. According to embodiments, when an organic film is formed, the formed area of the organic film may be limited, and thus the side moistureproof property of the organic light emitting display apparatus may be improved. As such, the side desiccative property of the organic light emitting display apparatus may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display apparatus, comprising:
    a substrate;
    a display unit on the substrate;
    a thin-film encapsulation layer for sealing the display unit, the thin-film encapsulation layer including a first organic film, a first inorganic film covering the first organic film, and a first interlayer disposed at and contacting a lower surface of the first organic film, the first interlayer defining an area where the first organic film is formed, the first interlayer and the first organic film having the same area;
    a second organic film on the first inorganic film;
    a second inorganic film covering the second organic film; and
    a second interlayer defining an area where the second organic film is formed, the second interlayer being between the first inorganic film and the second organic film.

2. The organic light emitting display apparatus as claimed in claim 1, wherein the first interlayer includes one or more of an alkali metal salt or an alkali earth metal salt.

3. The organic light emitting display apparatus as claimed in claim 1, wherein the first interlayer includes one or more of lithium fluoride, calcium fluoride, magnesium chloride, or sodium chloride, and the first organic film includes one or more of a polyurea or a polyacrylate.

4. The organic light emitting display apparatus as claimed in claim 1, wherein the first interlayer has a thickness of about 50 Å to about 600 Å.

5. The organic light emitting display apparatus as claimed in claim 1, further comprising a third inorganic film on the display unit, the first interlayer being between the third inorganic film and the first organic film.

6. The organic light emitting display apparatus as claimed in claim 1, wherein the first interlayer is hydrophilic, the first interlayer defining an entire area occupied by the first organic film, the first interlayer contacting the first organic film continuously across the entire area.

7. An organic light emitting display apparatus, comprising:
    a substrate;
    a display unit disposed on the substrate;
    a thin-film encapsulation layer for sealing the display unit, the thin-film encapsulation layer including a plurality of organic films, the plurality of organic films including a first organic film and a second organic film, a plurality of inorganic films alternately laminated with the plurality of organic films, the plurality of inorganic films including a first inorganic film and a second inorganic film, and a first interlayer disposed at and contacting a lower surface of the first organic film, the first interlayer including one or more of lithium fluoride, magnesium chloride, or sodium chloride, wherein:
    the second organic film is on the first inorganic film,
    the second inorganic film covers the second organic film, and
    a second interlayer defines an area where the second organic film is formed, the second interlayer being between the first inorganic film and the second organic film.

8. The organic light emitting display apparatus as claimed in claim 7, wherein the organic film that is contacted by the first interlayer includes one or more of a polyurea or a polyacrylate.

9. The organic light emitting display apparatus as claimed in claim 7, wherein the first interlayer defines an area where the first organic film on the lowest layer is formed, and the first interlayer and the first organic film on the lowest layer have the same area.

10. The organic light emitting display apparatus as claimed in claim 7, wherein the first interlayer is disposed at and contacts the lower surface of each of the plurality of organic films.

11. The organic light emitting display apparatus as claimed in claim 7, wherein the first interlayer is hydrophilic.

12. The organic light emitting display apparatus as claimed in claim 7, wherein the first interlayer contacts the display unit.

* * * * *